United States Patent
Doty

(10) Patent No.: US 8,737,645 B2
(45) Date of Patent: May 27, 2014

(54) INCREASING PERCEIVED SIGNAL STRENGTH USING PERSISTENCE OF HEARING CHARACTERISTICS

(71) Applicant: Archibald Doty, Hillsboro, OR (US)

(72) Inventor: Archibald Doty, Hillsboro, OR (US)

(*) Notice: Subject to any disclaimer, the term of this patent is extended or adjusted under 35 U.S.C. 154(b) by 0 days.

(21) Appl. No.: 13/648,970

(22) Filed: Oct. 10, 2012

(65) Prior Publication Data

US 2014/0098975 A1 Apr. 10, 2014

(51) Int. Cl.
*H03H 3/00* (2006.01)

(52) U.S. Cl.
USPC .......... 381/104; 381/61; 381/62; 381/63; 381/17; 381/19; 381/119; 381/101; 381/107; 704/500; 704/501; 704/502; 704/503; 704/504; 700/94

(58) Field of Classification Search
USPC .......... 381/61, 62, 63, 17, 19, 18, 119, 101, 381/107; 704/500–504; 700/94
See application file for complete search history.

(56) References Cited

U.S. PATENT DOCUMENTS

| | | | |
|---|---|---|---|
| 2,250,144 A | 7/1941 | Welty | |
| 3,197,575 A | 7/1965 | Eckstein | |
| 4,704,682 A | 11/1987 | Clynes | |
| 4,812,921 A | 3/1989 | Mitsuhashi et al. | |
| 4,999,773 A | 3/1991 | Clynes | |
| 5,469,508 A * | 11/1995 | Vallier | 381/63 |
| 5,531,224 A * | 7/1996 | Ellis et al. | 600/437 |
| 6,131,084 A * | 10/2000 | Hardwick | 704/230 |
| 6,237,947 B1 * | 5/2001 | Kausch | 280/735 |
| 6,850,487 B2 * | 2/2005 | Mukherjee et al. | 370/225 |
| 6,862,359 B2 * | 3/2005 | Nordqvist et al. | 381/312 |
| 7,492,907 B2 | 2/2009 | Klayman et al. | |
| 8,050,434 B1 | 11/2011 | Kato et al. | |
| 8,290,169 B1 * | 10/2012 | Caesar | 381/61 |
| 8,380,771 B2 * | 2/2013 | Hahn et al. | 708/309 |
| 2009/0287479 A1 * | 11/2009 | Szczerba et al. | 704/211 |
| 2013/0346070 A1 * | 12/2013 | Jung et al. | 704/200.1 |

FOREIGN PATENT DOCUMENTS

| | | |
|---|---|---|
| EP | 0641140 | 3/1995 |
| EP | 0768796 | 4/1997 |
| EP | 2109329 | 10/2009 |
| GB | 494477 | 10/1938 |
| GB | 949804 | 2/1964 |
| JP | 58170184 | 10/1983 |
| JP | 06070049 | 3/1994 |
| JP | 2011207392 | 10/2011 |
| WO | 9854927 | 12/1998 |

* cited by examiner

*Primary Examiner* — Davetta W Goins
*Assistant Examiner* — Kuassi Ganmavo
(74) *Attorney, Agent, or Firm* — Superior IP, PLLC; Dustin L. Call

(57) ABSTRACT

One example embodiment increases perceived signal strength of a sound signal based on persistence of hearing. When the ear perceives a signal it takes a finite length of time to process it. During that time period the ear does not recognize input and is, in effect, "Turned Off". In accordance with one aspect of the technology, these periods of "unheard" audio input are utilized so that they supplement the information which the ear sends to the brain. An exemplary system includes a switch, configured to route the audio alternatively to two signal paths—one which includes a delay circuit that delays that audio by an amount equal to the ear's persistence of hearing interval. The system also includes a signal combiner configured to combine outputs from the two signal paths, so as to provide the brain with a signal that it will perceive as being twice as loud as the original.

16 Claims, 3 Drawing Sheets

INCREASING PERCEIVED SIGNAL STRENGTH USING PERSISTENCE OF HEARING CHARACTERISTICS

CROSS-REFERENCE TO RELATED APPLICATIONS

Not applicable.

BACKGROUND OF THE INVENTION

Typically hearing devices and other hearing devices designed to amplify audio signals work in a similar manner. They receive an audio signal, convert it to an electronic signal, amplify the electronic signal then convert the amplified signal back to an audio signal using a speaker or other device. The speaker may be located near the user's ear to minimize the power needed and to prevent the amplification from disturbing others near the user.

However, this process leads to some drawbacks. For example, the amplification requires power input to the signal. Amplification of the signal increases the noise level of the signal. Likewise, the conversion of the audio signal to an electronic signal and vice versa both introduce further noise into the final audio signal. All of these sources of noise result in the output audio signal being of lower quality than the original signal.

Moreover, the same problems occur in electronic signals that will be converted into an audio signal. For example, in speakers and headphones, the electronic signal can be amplified prior to reaching the speaker. The speaker will then broadcast a louder signal to the user. However, the speaker may be limited in the volume of audio that it will produce. Additionally, the amplification of noise remains a problem.

Accordingly, there is a need in the art for a device that can amplify a sound signal without degrading the signal quality. In addition, there is a need in the art for the device to have low power requirements. Further, there is a need in the art for the device to avoid, to the extent possible, introducing noise into the sound signal.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

One example embodiment includes a system for increasing perceived signal strength of a sound signal based on persistence of hearing characteristics. The system includes a switch. The switch is configured to receive a sound signal at an input. The switch is also configured to divide the sound signal at predetermined intervals to create a first discrete signal and to create a second discrete signal. The system also includes a signal combiner configured to combine the first discrete signal and the second discrete signal into an output signal.

Another example embodiment includes a system for increasing perceived signal strength of a sound signal based on persistence of hearing characteristics. The system includes a switch. The switch is configured to receive a sound signal at an input. The switch is also configured to divide the sound signal at predetermined intervals to create a first discrete signal and to create a second discrete signal. The predetermined interval is shorter than the threshold for perception of hearing. The system also includes a first signal path and a second signal path. The switch is configured to output the first discrete signal on the first signal path and the second discrete signal on the second signal path. The system further includes a delay circuit, wherein the delay circuit is configured to delay the first discrete signal a predetermined amount of time, wherein the predetermined amount of time is equal to the predetermined interval. The system additionally includes a signal combiner configured to receive the first discrete signal from the first signal path. The signal combiner is also configured to receive the second discrete signal from the second signal path. The signal combiner is further configured to combine the first discrete signal and the second discrete signal into an output signal.

Another example embodiment includes a method of increasing perceived signal strength of a sound signal based on persistence of hearing characteristics. The method includes receiving a sound signal. The method also includes dividing the sound signal at predetermined intervals to produce a first discrete signal and a second discrete signal. The method further includes combining the first discrete signal and the second discrete signal.

These and other objects and features of the present invention will become more fully apparent from the following description and appended claims, or may be learned by the practice of the invention as set forth hereinafter.

BRIEF DESCRIPTION OF THE DRAWINGS

To further clarify various aspects of some example embodiments of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Reference will now be made to the figures wherein like structures will be provided with like reference designations. It is understood that the figures are diagrammatic and schematic representations of some embodiments of the invention, and are not limiting of the present invention, nor are they necessarily drawn to scale.

Figure 1:
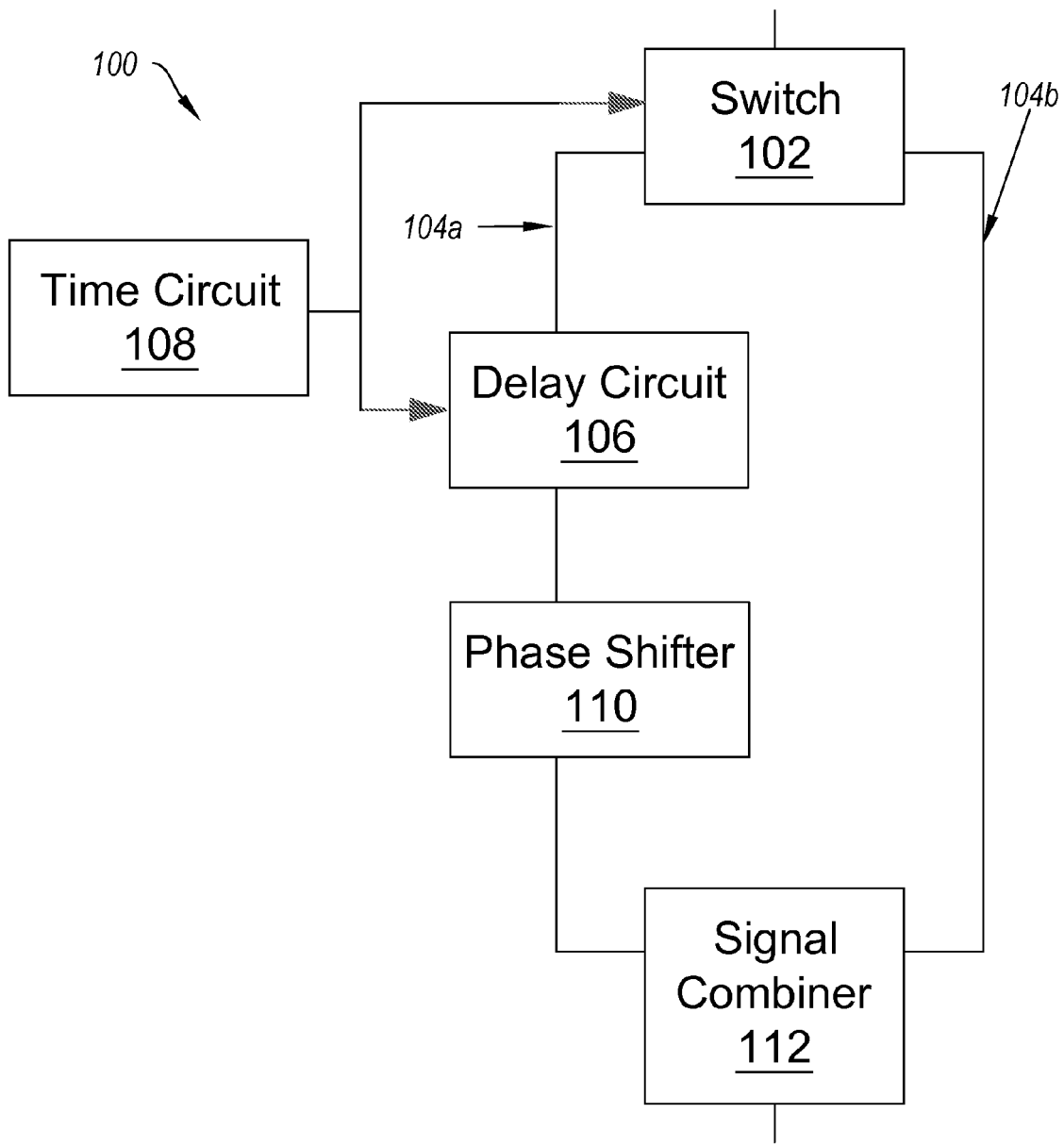
FIG. 1 illustrates an example of a system for increasing perceived signal strength.

FIG. 1 illustrates an example of a system 100 for increasing perceived signal strength. The system 100 can be configured to utilize the human ear's persistence of hearing characteristics. Persistence of hearing is the inability of the human ear to respond to distinct sounds within a specified time frame. For example, it may be that the brain, the ears or both are unable to process a sound signal within a certain period of time, thus the sound signal is perceived to last the entire "processing time." Persistence of hearing is similar to persistence of vision, which allows motion pictures or television to be perceived as a continuous signal, rather than individual frames.

For example, for movies a standard projection speed of 24 frames, or still pictures, per second was adopted. This was because a viewer stopped seeing individual frames at this speed and instead perceived a continuous motion picture.

The length of persistence of hearing depends on a number of factors including amplitude, pitch and whether the input is continuous sine waves or impulsive signals. However, in most cases, at about 40 Hz, a beat is heard as individual beats. As the frequency increases above about 50 Hz it is perceived by the human ear as a hum, or tone, rather than individual beats. In almost all cases when the frequency goes above 60 Hz the beats are heard as a hum, regardless of other factors. Therefore, the frequency above which persistence of hearing prevents hearing of a sine wave signal of individual beats can be approximated at 55 Hz. When the ear receives input in the form of impulsive signals the persistence of hearing becomes much shorter—approximately 0.006 seconds. As used in the specification and the claims, the term approximately shall mean that the value is within 10% of the stated value, unless otherwise specified.

Persistence of hearing also means that individual pauses cannot be heard. I.e., if one were to take a sound signal and remove portions of the continuous sine wave signal which have a duration of less than 0.018 seconds (which corresponds to a frequency of 55 Hz) the removal could not be perceived by a human ear. I.e., the sound signal would sound to a human ear as if the sound signal was unaltered. These characteristics can be taken advantage of to increase perceived signal strength without resulting in noticeable degradation of a sound signal.

This principle is illustrated by carefully designed experiments wherein Morse code was presented so as to determine the highest speed that could be perceived by the ear. These tests indicated that Persistence of Hearing lasts for approximately 0.006 seconds when impulsive sound signals are presented to the ear.

One of skill in the art will appreciate that a sound signal as used herein can refer to any signal which can be heard directly by a human or that can be converted to a signal that can be heard directly by a human. For example, a sound signal can include an audio signal, a radio signal, an electronic signal to be input into a speaker, or any other desired signal.

FIG. 1 shows that the system 100 can include a switch 102. The switch 102 can be configured to receive an input sound signal and divide the signal into discrete signals at predetermined intervals. For example, if the interval is 0.006 seconds, then every 0.006 seconds the switch will separate the input signal into discrete signals. An interval of 0.006 seconds can be critical to ensure that perception of hearing characteristics are used and that the user does not hear any disruption.

FIG. 1 also shows that the system 100 can include a first signal path 104a and a second signal path 104b (collectively "signal paths 104"). The first signal path 104a can be configured to receive every other discrete signal produced by the switch with the other discrete signals received by the second signal path 104b. For example, the first signal path 104a can receive the first discrete signal, the second signal path 104b can receive the second discrete signal, the first signal path 104a can receive the third discrete signal, etc. The signal paths 104 can include any medium configured to transmit the discrete signals.

FIG. 1 further shows that the system 100 can include a delay circuit 106. The delay circuit 106 can delay the first set of signals along the first signal path 104a. The delay can be as close as possible to the time interval of each discrete signal. I.e., if the switch 102 divides the input signal into discrete signals of 0.006 seconds, the desired delay of the delay circuit is 0.006 seconds. This will delay each signal so that it is as close as possible to the next discrete signal. I.e., the beginning of the first discrete signal will be delayed to match the beginning of the second discrete signal; the beginning of the third discrete signal will be delayed to match the beginning of the fourth discrete signal; etc. The delay circuit 106 can be adjustable to ensure correct syncing of the first discrete signal and the second discrete signal.

FIG. 1 additionally shows that the system 100 can include a time circuit 108. The time circuit can allow the switch 102 and the delay circuit 106 to operate using the same clock signal. I.e., the switch 102 and the delay circuit 106 can both be controlled by the output of the time circuit 108, ensuring that the time interval of the discrete signals is the same as the length of the delay. For example, the time circuit 108 can include a function generator, an oscillator or any other circuit producing a repeatable signal.

FIG. 1 moreover shows that the system 100 can include a phase shifter 110. The phase shifter 110 can correct the phase of the delayed signal to match the phase of the undelayed signal or vice versa. I.e., the phase shifter 110 can ensure that the delayed first discrete signal matches the phase of the second discrete signal.

FIG. 1 also shows that the system 100 can include a signal combiner 112. The signal combiner 112 can be configured to receive the delayed signal from the first signal path 104a and the undelayed signal from the second signal path 104b and combine the two signals. I.e., the first discrete signal was delayed in the delay circuit 106, phase shifted in the phase shifter 110 then combined with the unchanged second discrete signal in the signal combiner 112.

One of skill in the art will appreciate that the output signal from the signal combiner 112 will have effectively doubled the perceived signal strength. I.e., the power from the first time interval will be added to the power from the second time interval, doubling the perceived signal strength. In addition, because the empty gap produced is below the threshold for perception of hearing, the sound will be heard as a single continuous sound. Because the sound signal does not change appreciably between discrete signals, the user will not perceive any distortions but will perceive a signal that has doubled in power.

Figure 2:
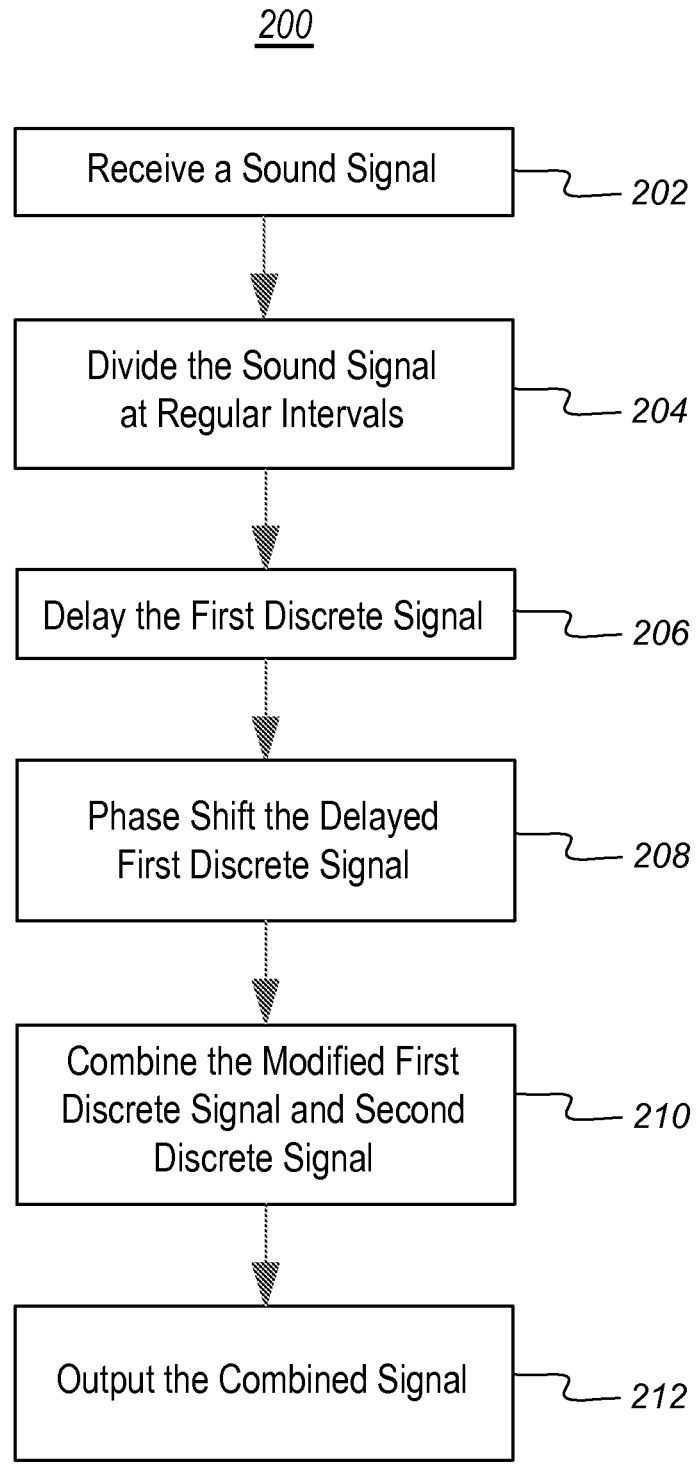
FIG. 2 is a flow chart illustrating a method of doubling perceived signal strength.

FIG. 2 is a flow chart illustrating a method 200 of doubling perceived signal strength. In at least one implementation, the method 200 can be used in a system, such as the system 100 of FIG. 1. Therefore, the method 200 will be described, exemplarily, with reference to the system 100 of FIG. 1. Nevertheless, one of skill in the art can appreciate that the method 200 can be performed by a system other than the system 100 of FIG. 1.

FIG. 2 shows that the method 200 can include receiving 202 a sound signal. The sound signal can be received 202 using a microphone, or can be received before it is sent to an output device, such as a speaker. The sound signal can be an audio signal, an electrical signal, an electromagnetic signal or any other desired signal.

FIG. 2 also shows that the method 200 can include dividing 204 the sound signal at regular intervals to produce a first discrete signal and second discrete signal. In particular, the signal can be divided 204 such that the duration of the first discrete signal and the second discrete signal are the same as one another. One of skill in the art will understand that although ensuring that the duration of the first discrete signal and the second discrete signal is the exact same is impossible, as used herein the term "the same" means that the duration of the first discrete signal and the second discrete signal as are close to one another as possible.

FIG. 2 further shows that the method 200 can include delaying 206 the first discrete signal. The first discrete signal 206 can be delayed the same amount of time as the duration of the first discrete signal such that the first discrete signal now begins at the same time as the second discrete signal begins. One of skill in the art will understand that delaying 206 the first discrete signal may not be necessary if the entire signal is present such as being stored electronically. However, if the signal is being received in real time, then the delay 206 may be necessary.

FIG. 2 additionally shows that the method 200 can include phase shifting 208 the delayed first discrete signal to produce a modified first discrete signal. Phase shifting 208 the first discrete signal can ensure that the first discrete signal and the second discrete signal are in phase with one another, which can reduce the perceived distortion of the signal. I.e., phase shifting 208 the first discrete signal can reduce distortion perceived by a listener.

FIG. 2 moreover shows that the method 200 can include combining 210 the first discrete signal and the second discrete signal. Combining 210 the first discrete signal and the second discrete signal doubles the perceived signal strength but does not require an addition of power. In particular, the human ear does not hear the first discrete signal and the second discrete signal as separate signals, therefore combining them results in unchanged perception in terms of the actual sound. However, the combined signals have a greater amplitude increasing the perceived volume.

FIG. 2 also shows that the method 200 can include outputting 212 the combined signal. The output 212 can be an audio signal that will be perceived by the user. Additionally or alternatively, the output 212 can include an electronic signal that will be output as an audio signal by an external device. For example, the output 212 can include sending the combined signal to a speaker, where the sound will be produced for the user.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 3:
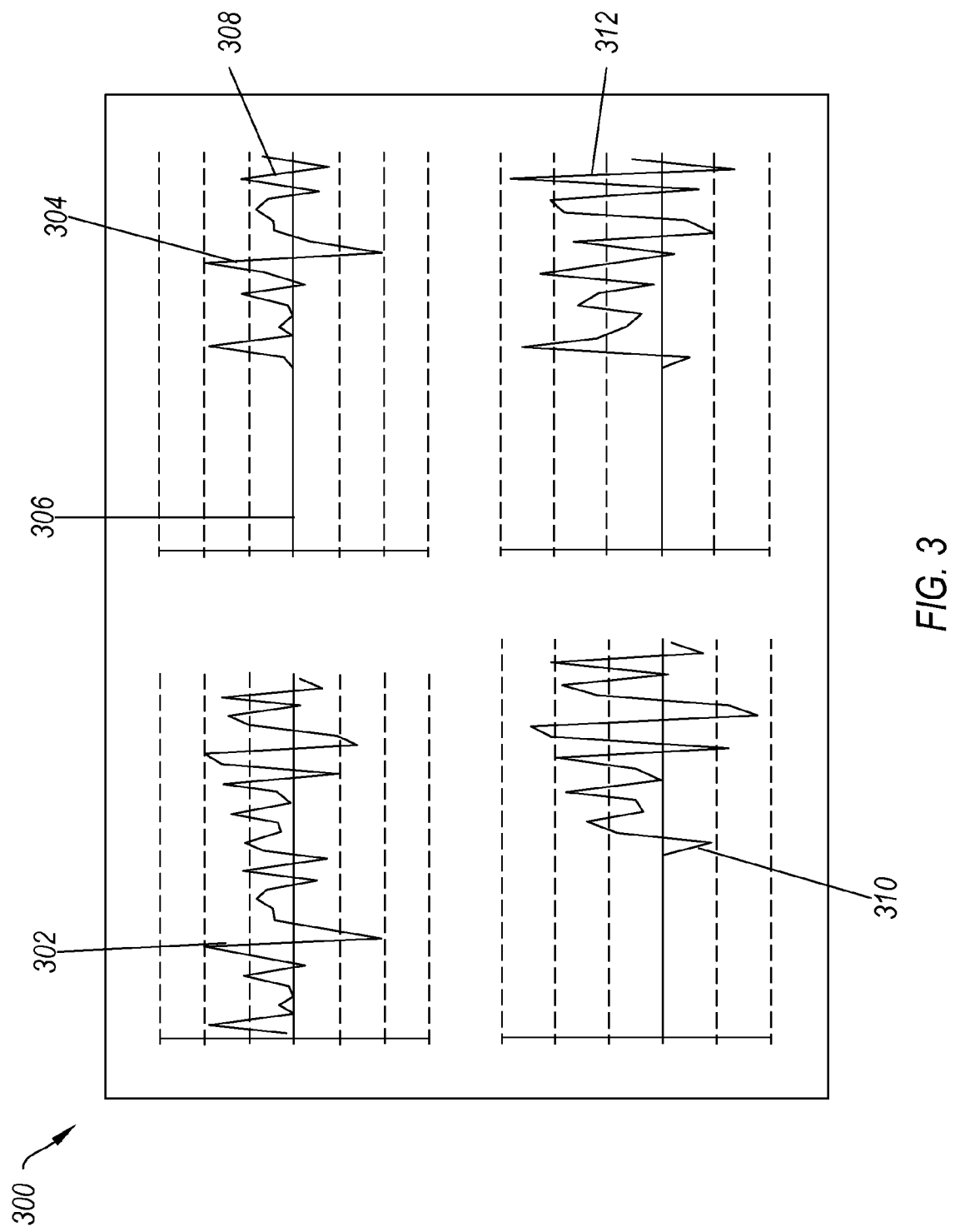
FIG. 3 illustrates an example of a waveform as it is modified.

FIG. 3 illustrates an example of a waveform 300 as it is modified. The waveform 300 can be modified in order to take advantage of perception of hearing. I.e., the waveform 300 can be modified to increase the perceived signal strength without requiring additional power.

FIG. 3 shows that the waveform 300 can initially be an unmodified waveform 302. The unmodified waveform 302 can include a sound signal, as described above. The unmodified waveform 302 can include portions before and after the portion shown; however, for illustrative purposes the waveform 302 can be used to show the modifications to the waveform 300 regardless on any signal that me be present before or after the waveform 302.

FIG. 3 also shows that the waveform 300 can be used to create a first discrete waveform 304. I.e., the waveform 302 after a first discrete signal is created, delayed and/or phase shifted to create the modified first discrete waveform 304. For example, the first discrete waveform 304 can be the waveform that has passed through the first signal path 104a of FIG. 1. The modified first discrete waveform 304 includes a first section 306 which includes no data or just noise and a second portion 308 which includes the first half of the data from the unmodified waveform 302.

FIG. 3 further shows that the waveform 300 can be used to create a second discrete waveform 310. The second discrete waveform 310 can be a portion of the original waveform 302 which remains unmodified after being separated from the first discrete waveform. For example, the second discrete waveform 310 can include the waveform which passed through the second signal path 104b of FIG. 1.

FIG. 3 additionally shows that the modified first discrete waveform 304 and the second discrete waveform 310 can be combined to produce an output waveform 312. The output waveform 312 can be perceived to be stronger than the original waveform 302 by a listener due to perception of hearing characteristics, as described above.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system for increasing perceived signal strength of a sound signal based on persistence of hearing characteristics, the system comprising:
   a switch configured to:
      receive a sound signal at an input;
      divide the sound signal at predetermined intervals to:
         create a first discrete signal including a first portion of the sound signal for a first interval of time; and
         create a second discrete signal including a second portion of the sound signal for a second interval of time contiguous to the first interval of time;
   a signal combiner configured to combine the first discrete signal and the second discrete signal into a combined signal and output an output signal the output signal including a first output portion including the combined signal and having a first duration equal to that of the first interval of time and a second output portion having no portion of the sound signal and having a second duration equal to that of the second interval.

2. The system of claim 1, further comprising:
   a first signal path; and
   a second signal path;
   wherein, the switch is configured to output:
      the first discrete signal to the first signal path; and
      the second discrete signal to the second signal path.

3. The system of claim 2, wherein the signal combiner is configured to receive:
   the first discrete signal from the first signal path; and
   the second discrete signal from the second signal path.

4. The system of claim 1, further comprising:
   a delay circuit, wherein the delay circuit is configured to delay the first discrete signal a predetermined amount of time.

5. The system of claim 4, wherein the predetermined amount of time is equal to the predetermined interval.

6. The system of claim 5 further comprising a time circuit configured to indicate the predetermined interval to the switch.

7. The system of claim 6, wherein the time circuit is further configured to indicate the predetermined amount of time.

8. The system of claim 1, further comprising a phase shifter configured to phase shift the first discrete signal to match the phase of the second discrete signal.

9. The system of claim 1, wherein the predetermined interval is shorter than a threshold for perception of hearing.

10. The system of claim 9, wherein the predetermined interval shorter than 0.006 seconds.

11. A system for increasing perceived signal strength of a sound signal based on persistence of hearing characteristics, the system comprising:
- a switch configured to:
  - receive a sound signal at an input;
  - divide the sound signal at predetermined intervals to:
    - create a first discrete signal including a first portion of the sound signal during a first time interval and having zero amplitude at a second time interval contiguous to the first time interval; and
    - create a second discrete signal including a second portion of the sound signal during the second time interval and having zero amplitude during the first time interval;
  - wherein the predetermined interval is shorter than the threshold for perception of hearing;
- a first signal path;
- a second signal path;
- wherein, the switch is configured to output:
  - the first discrete signal on the first signal path; and
  - the second discrete signal on the second signal path;
- a delay circuit, wherein the delay circuit is configured to delay the first discrete signal a predetermined amount of time, wherein the predetermined amount of time is equal to the predetermined interval; and
- a signal combiner configured to:
  - receive the first discrete signal from the first signal path;
  - receive the second discrete signal from the second signal path; and
  - combine the first discrete signal and the second discrete signal into an output signal having a first output portion including a combination of the first and second portions and a contiguous second output portion having zero amplitude.

12. The system of claim 11, further comprising a phase shifter configured to phase shift the first discrete signal to match the phase of the second discrete signal.

13. The system of claim 11, wherein the sound signal includes an audio signal.

14. The system of claim 11, wherein the sound signal includes an electronic signal to be converted to an audio signal.

15. The system of claim 11 further comprising a speaker configured to receive the output signal and output an audio signal.

16. A method of increasing perceived signal strength of an audio signal based on persistence of hearing characteristics, the method comprising:
- receiving the audio signal;
- (a) for a first interval of time, routing the audio signal, as it is received, to an input of a delay stage, and not to an output terminal;
- (b) for a second, next interval of time, combining the audio signal as it is received, with a delayed signal from an output of the delay stage, said delayed signal comprising the audio signal from the first interval of time;
- (c) providing the combined signal to the output terminal; and
- repeating acts (a), (b), and (c), sequentially, for subsequent intervals of time, the aforesaid intervals of time being equal in duration;
- wherein combining the audio signal as it is received with the delayed signal comprises combining the audio signal and delayed signal such that the output terminal alternates at said intervals between (i) providing no signal, and (ii) providing a combined signal that is a combination of a received audio signal and a delayed audio signal, said combined signal having a strength that is greater than that of the received audio signal alone; and
- wherein said greater strength at alternating intervals leads a human listener to perceive the signal on the output terminal as louder than the received audio signal, despite the absence of signal for intervening intervals, due to the persistence of hearing phenomenon of the human auditory system.

* * * * *